United States Patent
Toh et al.

(10) Patent No.: US 11,791,083 B2
(45) Date of Patent: Oct. 17, 2023

(54) TUNNEL MAGNETO-RESISTIVE (TMR) SENSOR WITH PERPENDICULAR MAGNETIC TUNNELING JUNCTION (P-MTJ) STRUCTURES

(71) Applicant: GLOBALFOUNDRIES Singapore Pte. Ltd., Singapore (SG)

(72) Inventors: Eng-Huat Toh, Singapore (SG); Hemant M. Dixit, Halfmoon, NY (US); Vinayak Bharat Naik, Singapore (SG); Kazutaka Yamane, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 191 days.

(21) Appl. No.: 17/330,934

(22) Filed: May 26, 2021

(65) Prior Publication Data
US 2022/0384082 A1 Dec. 1, 2022

(51) Int. Cl.
*H01F 10/32* (2006.01)
*G01R 33/09* (2006.01)
*H01F 41/32* (2006.01)

(52) U.S. Cl.
CPC ....... *H01F 10/3272* (2013.01); *G01R 33/098* (2013.01); *H01F 10/3254* (2013.01); *H01F 41/32* (2013.01)

(58) Field of Classification Search
None
See application file for complete search history.

(56) References Cited

U.S. PATENT DOCUMENTS

| | | | | |
|---|---|---|---|---|
| 6,104,632 A | * | 8/2000 | Nishimura | G11C 11/155 365/158 |
| 10,236,075 B1 | * | 3/2019 | Kim | G11C 29/76 |
| 11,112,468 B2 | * | 9/2021 | Braganca | G11B 5/02 |
| 2007/0063690 A1 | * | 3/2007 | De Wilde | G01R 31/3004 324/117 R |
| 2007/0099031 A1 | * | 5/2007 | Chung | G01L 19/16 428/815 |
| 2008/0084205 A1 | * | 4/2008 | Zimmer | B82Y 25/00 374/185 |
| 2011/0147867 A1 | * | 6/2011 | Slaughter | B82Y 25/00 257/E21.705 |
| 2011/0244599 A1 | * | 10/2011 | Whig | H01L 43/08 257/E21.585 |

(Continued)

OTHER PUBLICATIONS

Phan, et al., "Geometry Optimization of TMR Current Sensors for On-Chip IC Testing", IEEE Transactions on Magnetics, vol. 41, No. 10, Oct. 2005, 3 pages.

(Continued)

*Primary Examiner* — Kevin M Bernatz
(74) *Attorney, Agent, or Firm* — David Cain; Andrew M. Calderon; Calderon Safran & Cole P.C.

(57) ABSTRACT

The present disclosure relates to integrated circuits, and more particularly, a tunnel magneto-resistive (TMR) sensor with perpendicular magnetic tunneling junction (p-MTJ) structures and methods of manufacture and operation. The structure includes: a first magnetic tunneling junction (MTJ) structure on a first level; a second MTJ structure on a same wiring level as the first MTJ structure; and at least one metal line between the first MTJ structure and the second MTJ structure.

20 Claims, 5 Drawing Sheets

(56) References Cited

U.S. PATENT DOCUMENTS

| | | | | |
|---|---|---|---|---|
| 2012/0049843 | A1* | 3/2012 | Sun | H01L 43/12 |
| | | | | 324/252 |
| 2015/0177285 | A1* | 6/2015 | Higashi | G01R 15/205 |
| | | | | 324/144 |
| 2020/0312907 | A1* | 10/2020 | Ouellette | H01L 43/08 |
| 2021/0055360 | A1* | 2/2021 | Mauri | G01R 33/0094 |
| 2021/0063503 | A1* | 3/2021 | Hu | H01L 43/12 |
| 2021/0063508 | A1* | 3/2021 | Hu | G01R 33/0023 |
| 2022/0165941 | A1* | 5/2022 | Mather | G01R 33/096 |

OTHER PUBLICATIONS

Cubells et al., "Magnetic Tunnel Junction (MTJ) Sensors for Integrated Circuits (IC) Electric Current Measurement", IEEE, 2013, 4 pages.

Flores, "MgO Magnetic Tunnel Junction sensors in Full Wheatstone Bridge configuration for in-chip current field detection", Instituto Superior Técnico, Univesidade Técnica de Lisboa, Thesis, Oct. 2010, 95 pages.

Sanchez et al., "Electrical Characterization of a Magnetic Tunnel Junction Current Sensor for Industrial Applications", IEEE Transactions on Magnetics, vol. 48, No. 11, Nov. 2012, 4 pages.

* cited by examiner

TUNNEL MAGNETO-RESISTIVE (TMR) SENSOR WITH PERPENDICULAR MAGNETIC TUNNELING JUNCTION (P-MTJ) STRUCTURES

FIELD OF THE INVENTION

The present disclosure relates to integrated circuits, and more particularly, to a tunnel magneto-resistive (TMR) sensor with perpendicular magnetic tunneling junction (p-MTJ) structures and methods of manufacture and operation.

BACKGROUND

In magnetic sensor technology, a Hall sensor is a device which can measure a magnitude of a magnetic field. An output voltage of the Hall sensor is directly proportional to a magnetic field strength and can be used for proximity sensing, positioning, speed detection, and current sensing applications.

Anisotropic magneto-resistance (AMR) sensors measure changes in an angle of a magnetic field by using iron material. The resistance of the iron material in the AMR sensors depends on a direction of current flow and direction of magnetization. The AMR sensors determine non-contact position measurements in harsh environments.

Giant magneto-resistance (GMR) sensors use quantum mechanics effects with a non-magnet material between two iron material layers. The GMR sensors result in high resistance for anti-parallel spin alignment and low resistance for parallel spin alignment, when a current passes through one of the two iron material layers.

In comparison, tunnel magnetoresistance (TMR) sensors have magnetic tunneling junction (MTJ) elements which have resistance changes with a parallel alignment or an anti-parallel alignment. The TMR sensors with the MTJ elements may be used for extended applications beyond the above type of sensors. The known TMR circuitry includes in-plane MTJs with U-shaped metal lines on top and/or bottom of the MTJs.

SUMMARY

In an aspect of the disclosure, a structure comprises: a first magnetic tunneling junction (MTJ) structure on a first level; a second MTJ structure on a same wiring level as the first MTJ structure; and at least one metal line between the first MTJ structure and the second MTJ structure.

In another aspect of the disclosure, a structure comprises: a first magnetic tunneling junction (MTJ) structure on a first wiring level; a second MTJ structure on the first wiring level; upper metal line of the first MTJ structure and the second MTJ structure at a second wiring level; lower metal line of the first MTJ structure and the second MTJ structure at a third wiring level; and at least one metal line between the first MTJ structure and the second MTJ structure and at the wiring level at least to one of the lower metal line and the upper metal line.

In another aspect of the disclosure, a method comprises: forming a first magnetic tunneling junction (MTJ) on a first level; forming a second magnetic tunneling junction (MTJ) on a same wiring level as the first MTJ structure; and forming at least one metal line between the first MTJ structure and the second MTJ structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to integrated circuits, and more particularly, to a tunnel magneto-resistive (TMR) sensor with perpendicular magnetic tunneling junction (p-MTJ) structures and methods of manufacture and operation. More specifically, the TMR sensor comprises perpendicular MTJs connected in a Wheatstone bridge configuration with one or more parallel metal lines between groups of MTJs. Advantageously, the p-MTJ structures described herein have an improved sensitivity with enhanced magnetic field detection with closer proximity.

In embodiments, the TMR sensor includes two magnetic tunneling junction (MTJ) structures on a same wiring level, and at least one current conducting metal line at a different wiring level than the MTJ structures. In alternative embodiments, four MTJ structures may be on a first or same wiring level, with a first current conducting metal line at a higher level than the MTJ structures and a second current conducting metal line at a lower level than the MTJ structures.

The TMR sensors of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the TMR sensors are built on wafers and are realized in films of material patterned by photolithographic processes on the top of a wafer. In particular, the fabrication of the TMR sensors uses three basic building blocks: (i) deposition of thin films of material on a substrate, (ii) applying a patterned mask on top of the films by photolithographic imaging, and (iii) etching the films selectively to the mask.

Figure 1A:
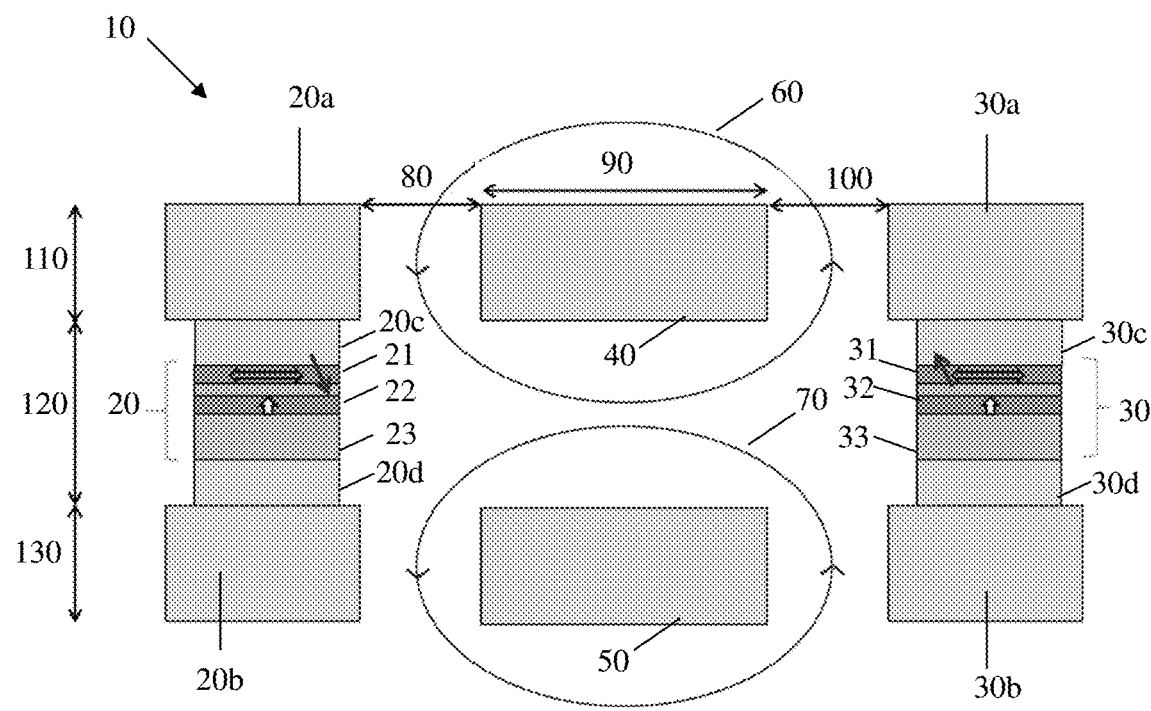
FIG. 1A shows a perpendicular magnetic tunneling junction (p-MTJ) structure, and respective fabrication processes, in accordance with aspects of the present disclosure.

FIG. 1A shows a perpendicular magnetic tunneling junction (p-MTJ) structure and respective fabrication processes in accordance with aspects of the present disclosure. In FIG. 1A, the p-MTJ structure 10 includes magnetic tunneling junctions (MTJs) 20, 30, and metal lines 40, 50 with respective magnetic fields 60, 70. In embodiments, the metal lines 40, 50 are parallel current conducting metal lines between the MTJs 20, 30. For example, the parallel metal line 40 conducts a current with a magnetic field 60; whereas, the parallel metal line 50 conducts a current with a magnetic field 70. As such, the p-MTJ structure 10 can perform current monitoring with the two parallel metal lines 40, 50. Further, it should be understood by those of skill in the art that each of the MTJs 20, 30 in the figures may be a group of MTJs connected in series and parallel.

The MTJs 20, 30 each contact or connect to upper and lower metal lines 20a, 20b, and 30a, 30b, respectively. As shown in FIG. 1, the metal line 40 may be on a same wiring level as metal lines 20a, 30a; whereas, the metal line 50 may be on a same wiring level as metal lines 20b, 30b. In embodiments, the MTJs 20, 30 are placed between a metal level of the metal line 40 (metal level "x" and a metal level of the metal line 50 (metal level "x+1"). Further, the upper and lower contacts 20c, 20d, and 30c, 30d directly contact the MJTs 20 and 30, respectively. In embodiments, the contacts 20c, 20d, 30c, and 30d could be smaller or larger than the MJTs 20, 30.

Still referring to FIG. 1A, the MTJ 20 includes a free layer 21, a fixed layer 22, and a synthetic anti-ferromagnetic (SAF) layer 23. Similarly, the MTJ 30 includes a free layer 31, a fixed layer 32, and a SAF layer 33. The free layers 21, 31 and the fixed layers 22, 32 may comprise alloys and/or multilayers of cobalt, iron, alloys of cobalt-iron, nickel, alloys of nickel iron, and alloys of cobalt-iron-boron. Other materials suitable as free layers are also contemplated herein. The MTJs 20, 30 may include any combination of Tantalum, Ruthenium, Magnesium Oxide, Platinum, and/or Cobalt as required for specific applications and no further explanation is required for a complete understanding of the present disclosure. The fixed layers 22, 32 have a magnetic field pointed in an upward direction, which causes the MTJ 20 to have a high resistance and the MTJ 30 to have a low resistance. In embodiments, the free layers 21, 31 have an in-plane magnetization (i.e., pointing to the left direction or the right direction) in the absence of a magnetic field (i.e., no current in the metal lines 40, 50); whereas, when current passes through the metal lines 40, 50, magnetic fields are generated, thereby causing one MTJ (e.g., MTJ 20) to have the free layer (e.g., free layer 21) pointing in the downward direction while the other MTJ (e.g., MTJ 30) has the free layer (e.g., free layer 31) pointing in the upward direction. The magnitude of the upward or downward direction (i.e., an upward or downward angle) can depend on a strength of a magnetic field induced by the current.

In FIG. 1A, the fixed layer 22, 32 of the p-MTJ structure 10 comprise perpendicular fixed layers 22, 32, which provide improved tunnel magneto-resistive (TMR) effects and sensitivity to current. In a specific example, the TMR ratio is a high resistance to low resistance ratio, and the TMR ratio is 2 (i.e., approximately 200% greater for the high resistance in comparison to the low resistance). In contrast, known circuits have in-plane MTJs, which have lower TMR and sensitivity. Further, the p-MTJ structure 10 comprises parallel metal lines 40, 50 (hereinafter referred to as metal lines) in closer proximity to the MTJs 20, 30, as than compared to known circuits. Therefore, the p-MTJ structure 10 has an enhanced magnetic field, in comparison to known circuits. In embodiments, due to a closer proximity to the MTJs 20, 30, any change in current of the metal lines 40, 50 may lead to a larger change in the magnetic field in comparison to known circuits in which metal lines are further away from the MTJs.

The p-MTJ structure 10 can perform current monitoring with the two parallel metal lines 40, 50. This configuration is more compact than known circuitry, which uses a horse shoe/U-shaped configuration with two current directions for a Wheatstone bridge. For example, a height 110 of the metal line 40 and height 130 of the metal line 50 may be approximately 100-300 nanometers. Further, a distance 120 between the MTJs 20, 30 may be between 100 nanometers and 300 nanometers. The metal lines 40, 50 may be on a same level as the respective upper and lower metal lines 20a, 20b, and 30a, 30b (e.g., metal line pads that the MTJ with electrodes/contacts/vias land on), with a length 90 of the metal lines 40, 50 in the range between 100 nanometers and 500 nanometers. Moreover, a distance 80, 100 between the metal lines 40, 50 and respective metal lines 20a, 20b and 30a, 30b may be between 50 nanometers and 200 nanometers. The above dimensions are provided as illustrative examples and, as such, it should be understood by those of skill in the art that other dimensions are contemplated herein.

The p-MTJ structure 10 in FIG. 1A can be formed by conventional deposition, lithography, and etching methods known to those of skill in the art. For example, each of the layers of material in the p-MTJ structure 10 can be deposited by a conventional deposition method such as a physical vapor deposition (PVD) or a chemical vapor deposition (CVD) process. Following the deposition processes, a resist formed over a topmost material is exposed to energy (light) to form a pattern (opening). An etching process with a selective chemistry, e.g., reactive ion etching (RIE), will be used to pattern the materials through the openings of the resist to form the respective p-MTJ structure 10. The resist can be removed by a conventional oxygen ashing process or other known stripants.

In embodiments, the contacts 20c, 20d, 30c, and 30d may be formed separately from the formation of the MTJs 20, 30. For example, a via may be formed on the metal line 20b first, followed by formation of the MTJ 20, and then forming a contact 20c. The metal 20a may then be formed. In this scenario, the via could be either bigger or smaller than the MTJ 20, but smaller than the metal line 20b. In other embodiments, the contacts may not be needed.

Figure 1B:
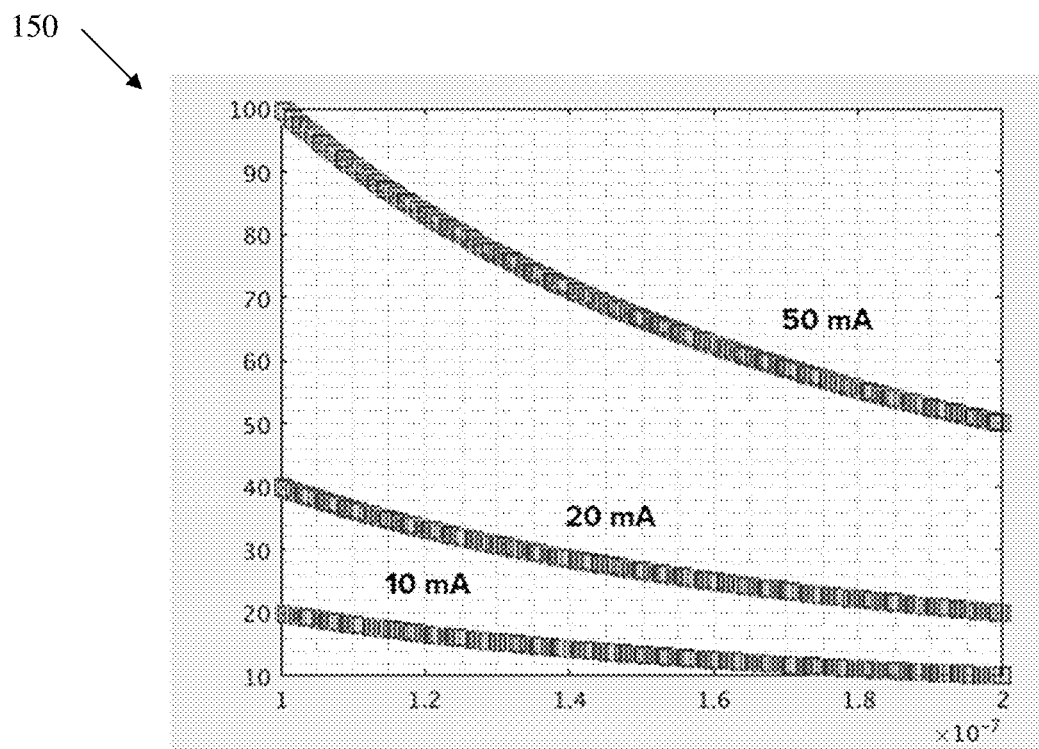
FIG. 1B shows a performance graph of magnetic field strength versus distance away from metal lines in accordance with aspects of the present disclosure.

FIG. 1B shows a performance graph of magnetic field strength versus distance away from metal lines. In graph 150, the X-axis represents distance in meters and the Y-axis represents magnetic field in millitesla. The graph 150 shows that as the distance d between the MTJs 20, 30 and their corresponding metal lines 40, 50 becomes larger (i.e., distance d in meters in the X-axis), the magnetic field B becomes lower (i.e., magnetic field B in millitesla in the Y-axis) in different current scenarios (i.e., 10 mA, 20 mA, and 50 mA). For example, as the current increases, the magnetic field becomes stronger.

Figure 2A:
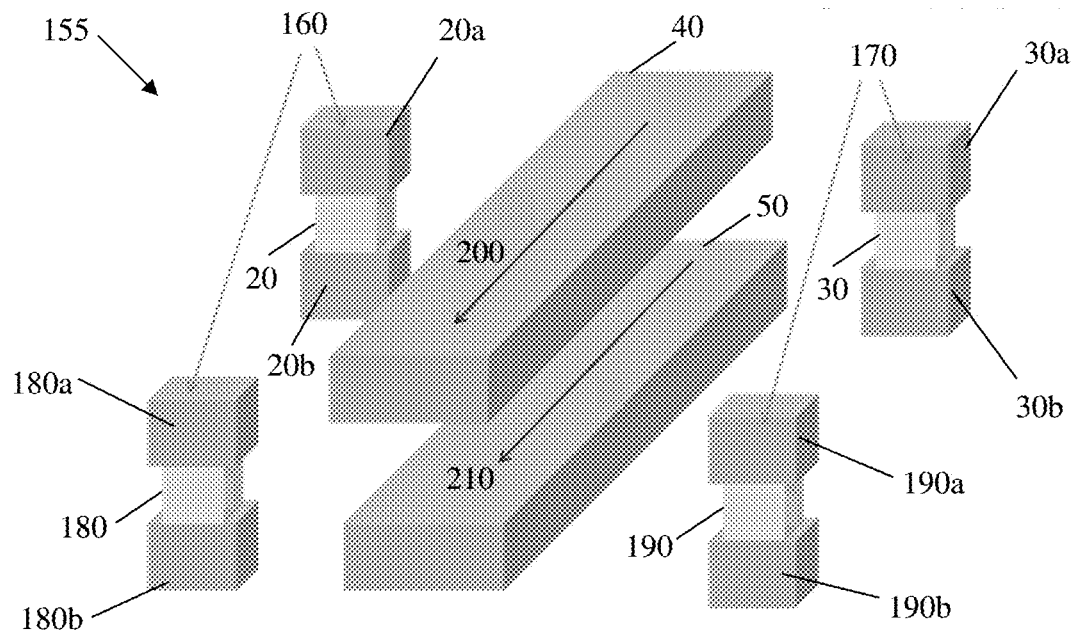
FIG. 2A shows a Wheatstone bridge structure comprising the p-MTJ structures, amongst other features, in accordance with aspects of the present disclosure.

FIG. 2A shows a Wheatstone bridge structure comprising MTJs 20, 30, 180, 190. More specifically, a Wheatstone bridge structure 155 includes parallel metal lines 40, 50 between the MTJs 20, 30, 180, 190. In embodiments, the MTJs 20, 180 form a first dual MTJ structure 160 and the MTJs 30, 190 form a second dual MTJ structure 170, with the first dual MTJ structure 160 connected to the second dual MTJ structure 170 to form the Wheatstone Bridge structure 155. The metal lines 40, 50 include current directions 200, 210, respectively, in a same current direction. The metal lines 40, 50 may be on a same level as the respective upper and lower metal lines 20a, 30a, 180a, 190a and 20b, 30b, 180b, and 190b. The metal lines 40, 50 may be between the MTJs 20, 30, 180, and 190. In particular, the MTJs 20, 30, 180, and 190 are at the same metal level layers (i.e., at a same level). In embodiments, the MTJs 20, 30, 180, and 190 may be the same type of MTJs. Also, the MTJs 20, 30, 180, and 190 may be p-MTJs as already described herein, i.e., comprising perpendicular fixed layers.

In the Wheatstone bridge structure 155, each of the fixed layers of the MTJs 20, 30, 180, and 190 have a magnetization direction pointed in an upward direction, which causes the MTJs 20, 180 to have a high resistance and the MTJs 30, 190 to have a low resistance, thereby causing an increased tunnel magneto-resistive (TMR) effect. In FIG. 2A, each MTJ (e.g., MTJ 20) of the Wheatstone bridge structure 155 may be in a series and/or parallel configuration.

Figure 2B:
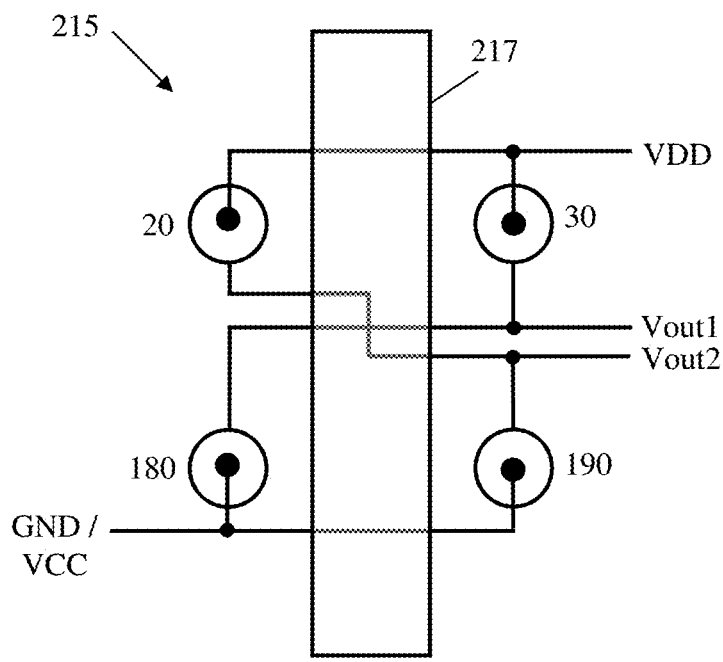
FIG. 2B shows a circuit schematic of the Wheatstone bridge structure, amongst other features, in accordance with aspects of the present disclosure.

FIG. 2B shows a circuit schematic of the Wheatstone bridge structure 155, amongst other features. In the circuit schematic 215, the MTJs 20, 30, 180, and 190 may be in a Wheatstone Bridge configuration with a current carrying wire 217 between the first dual MTJ structure 160 (i.e., the MTJs 20, 180) and the second dual MTJ structure 170 (i.e., the MTJs 30, 190). The MTJs 20, 30 may be connected to a first power supply VDD and the MTJs 180, 190 may be connected to a second power supply VCC/ground GND. Further, a first voltage output Vout1 may be connected to the MTJs 30, 180. A second voltage output Vout2 may be connected to the MTJs 20, 190. Also, each of the fixed layers of the MTJs 20, 30, 180, and 190 have a magnetization direction pointed in an upward direction, which causes the MTJs 20, 180 to have a high resistance and the MTJs 30, 190 to have a low resistance. In particular, the current direction of the current carrying wire 217 can determine whether the resistance is a low resistance or a high resistance.

Figure 2C:
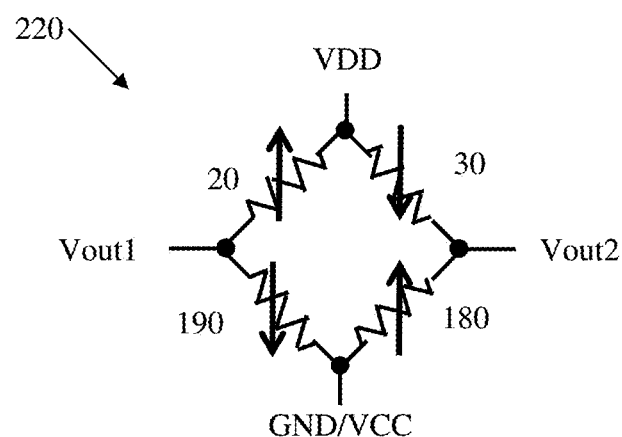
FIG. 2C shows another circuit schematic of the Wheatstone bridge structure, amongst other features, in accordance with aspects of the present disclosure.

FIG. 2C shows another circuit schematic of the Wheatstone bridge structure, amongst other features. In the schematic 220 of the Wheatstone bridge structure, the first power supply VDD may be connected to the MTJs 20, 30 and the second power supply VCC/ground GND may be connected to the MTJs 180, 190. The first voltage output Vout1 may be connected to the MTJs 20, 190 and the second voltage output Vout2 may be connected to the MTJs 30, 180. In FIG. 2C, each of the fixed layers of the MTJs 20, 30, 180, and 190 have a magnetic field pointed in a downward direction, which causes the MTJs 30, 190 to have a high resistance and the MTJs 20, 180 to have a low resistance.

Figure 3:
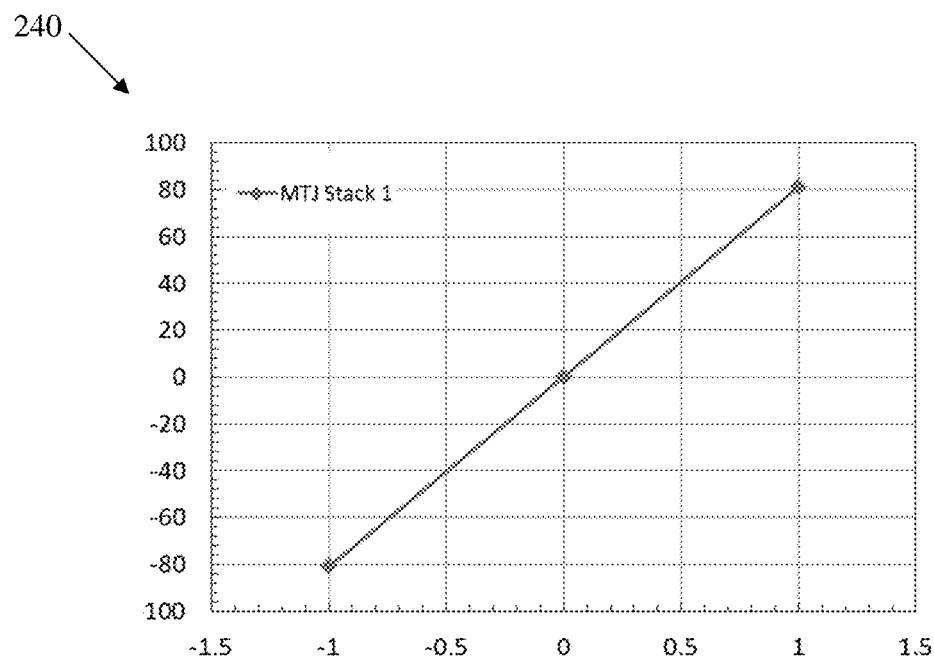
FIG. 3 shows another performance graph of the Wheatstone bridge structure in accordance with aspects of the present disclosure.

FIG. 3 shows another performance graph of the Wheatstone bridge structure in accordance with aspects of the present disclosure. In graph 240, the X-axis is representative of current Icc in milliamps and the Y-axis is representative of output voltage in millivolts. The graph 240 shows that as the current increases (i.e., current increases (i.e., current Icc in milliamps in the X-axis), the output voltage increases (i.e., output voltage Vout in millivolts) for a MTJ stack (i.e., MTJs of the p-MTJ structure).

Figure 4A:
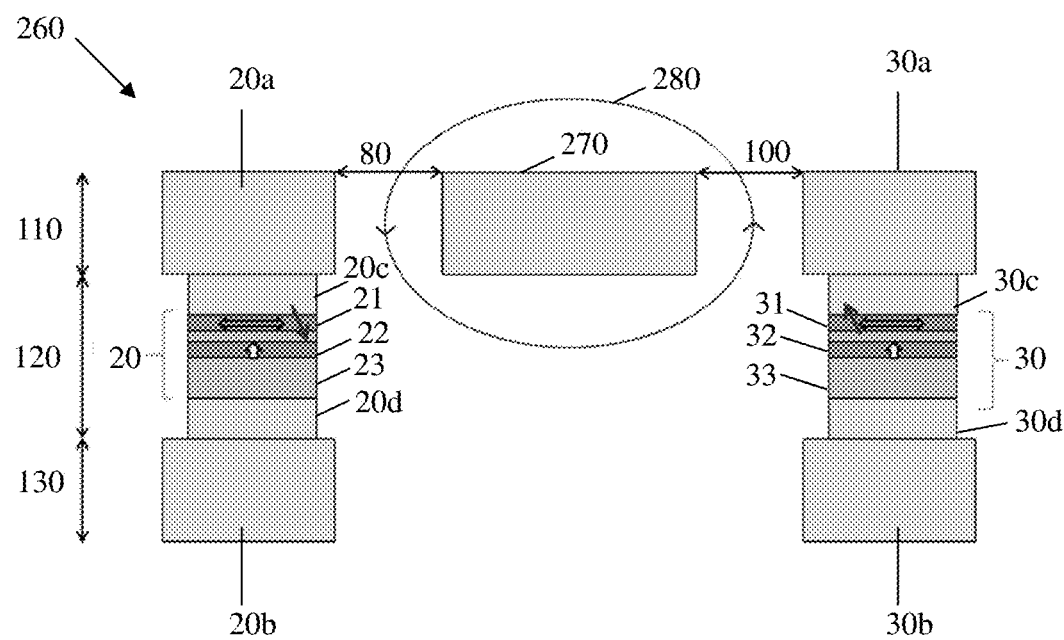
FIG. 4A shows a p-MTJ in accordance with additional aspects of the present disclosure.

FIG. 4A shows another p-MTJ structure in accordance with aspects of the present disclosure. FIG. 4A is similar to the structure 10 of FIG. 1A, with the exception that the p-MTJ structure 260 of FIG. 4A includes only one metal line 270 with a magnetic field 280 at a top of the structure between upper metal lines 20a, 30a. In an alternative embodiment, the metal line 270 can be at a bottom of the structure with the height 130 (i.e., at the bottom of the another p-MTJ structure 260). Similar to FIG. 1A, the p-MTJ structure 260 provides improved tunnel magneto-resistive (TMR) and sensitivity to current than known circuits.

Figure 4B:
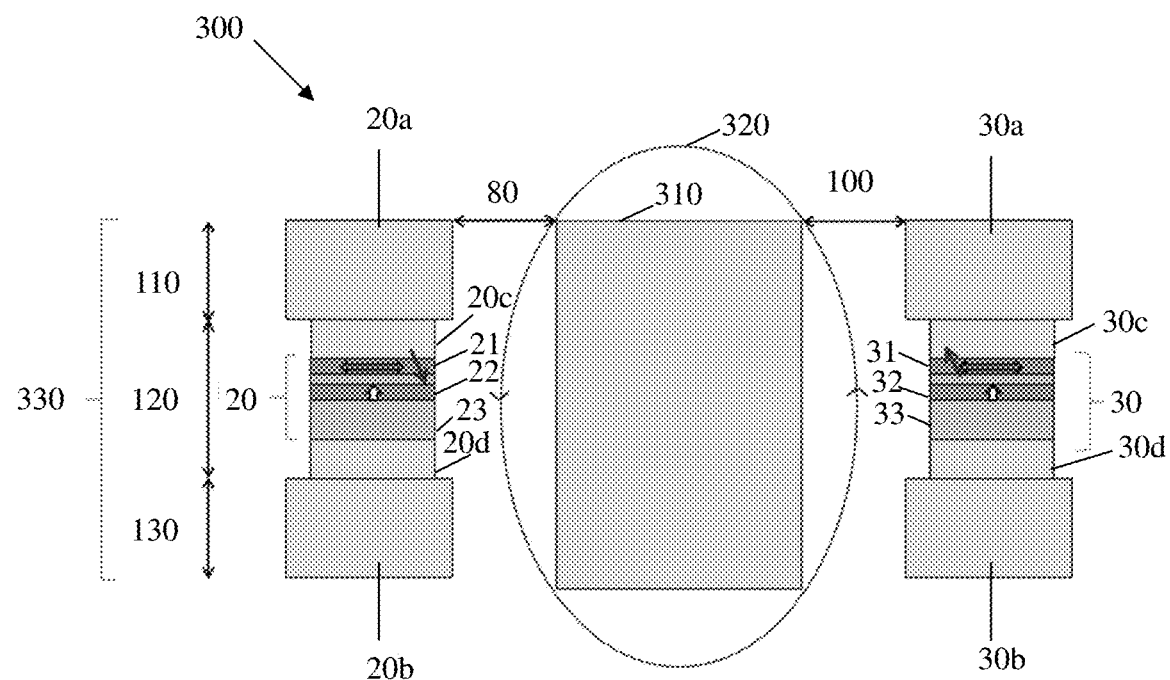
FIG. 4B shows a p-MTJ structure in accordance with further aspects of the present disclosure.

FIG. 4B shows a p-MTJ structure in accordance with another aspect of the present disclosure. FIG. 4B is similar to FIG. 1A, with the exception that the p-MTJ 300 includes a single metal line 310 with extending the full extent of the MTJ and its contacts and metal lines, as represented by reference 330, e.g., a combined height as represented by references numerals 110, 120, 130. The single metal line 310 may also have a single magnetic field 320. Similar to FIG. 1A, the p-MTJ structure 300 provides improved tunnel magneto-resistive (TMR) and sensitivity to current than known circuits.

A tunnel magnetoresistance sensor (TMR) with P-MTJ structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as Smartphones) and edge computing markets. SoC is also commonly used in embedded systems and the Internet of Things.

The structures and methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    a first magnetic tunneling junction (MTJ) structure on a first wiring level;
    a second MTJ structure on a same wiring level as the first MTJ structure; and
    at least one metal line between the first MTJ structure and the second MTJ structure,
    wherein the at least one metal line is physically separated from the first MTJ structure and the second MTJ structure, and the at least one metal line provides a current in a direction different from the magnetization direction of the first MTJ structure and the second MTJ structure, and wherein the first MTJ structure and second MTJ structure are each located between upper and lower contacts.

2. The structure of claim 1, wherein the first MTJ structure and the second MTJ structure are perpendicular MTJs.

3. The structure of claim 1, wherein the first MTJ structure and the second MTJ structure comprise a Wheatstone Bridge.

4. The structure of claim 1, wherein the at least one metal line comprises a first metal line and a second metal line, and the first metal line is parallel with the second metal line.

5. The structure of claim 1, wherein the first MTJ structure comprises a synthetic anti-ferromagnetic (SAF) layer.

6. The structure of claim 1, wherein the first MTJ structure and the second MTJ structure each comprises a free layer and a fixed layer.

7. The structure of claim 6, wherein the free layer of the first MTJ structure and the second MTJ structure comprises Cobalt-Iron-Boron.

8. The structure of claim 6, wherein the fixed layer of the first MTJ structure and the second MTJ structure comprises Cobalt-Iron-Boron.

9. The structure of claim 1, wherein the first MTJ structure and second MTJ structure further comprise a same combination of layers of Tantalum, Ruthenium, Magnesium Oxide, Platinum, and Cobalt.

10. The structure of claim 1, wherein the at least one metal line includes at least one single metal line on a same wiring level as either the first MTJ structure or the second MTJ structure.

11. The structure of claim 10, wherein the at least one single metal line is an upper metal line at a same wiring level of the first MTJ structure and the second MTJ structure.

12. The structure of claim 10, wherein the at least one single metal line is a lower metal line at a same wiring level of the first MTJ structure and the second MTJ structure.

13. The structure of claim 10, wherein the single metal line comprises a combined height extending from an upper metal line and upper contact of the first MTJ structure to a lower metal line and lower contact of the first MTJ structure and the first MTJ structure, itself.

14. The structure of claim 1, further comprising a third MTJ structure and a fourth MTJ structure, wherein:
the third MTJ structure and fourth MTJ structure are at the same wiring level as the first MTJ structure;
the first and third MTJ structures comprises a first dual MTJ structure;
the second and fourth MTJ structures comprises a second dual MTJ structure;
the first dual MTJ structure connects to the second dual MTJ structure to form a Wheatstone Bridge structure; and
the at least one metal line is between the first dual MTJ structure and the second dual MTJ structure.

15. A structure, comprising:
a first magnetic tunneling junction (MTJ) structure on a first wiring level;
a second MTJ structure on the first wiring level;
an upper metal line of the first MTJ structure and the second MTJ structure at a second wiring level;
a lower metal line of the first MTJ structure and the second MTJ structure at a third wiring level; and
at least one metal line between the first MTJ structure and the second MTJ structure and at the wiring level at least to one of the lower metal line and the upper metal line,
wherein the at least one metal line is physically separated from the first MTJ structure and the second MTJ structure, and the at least one metal line provides a current in a direction different from the magnetization direction of the first MTJ structure and the second MTJ structure.

16. The structure of claim 15, wherein the first MTJ structure and the second MTJ structure comprise a Wheatstone bridge.

17. The structure of claim 15, wherein the at least one metal line comprises two parallel metal lines, a first metal line of the two parallel metal lines being at the second wiring level and a second metal line of the two parallel metal lines being at the third wiring level.

18. The structure of claim 15, wherein the at least one metal line extends from through the first, second and third wiring level.

19. The structure of claim 15, further comprising a third MTJ structure and a fourth MTJ structure, wherein:
the third MTJ structure and fourth MTJ structure are at the first wiring level;
the first and third MTJ structures comprises a first dual MTJ structure;
the second and fourth MTJ structures comprises a second dual MTJ structure;
the first dual MTJ structure connects to the second dual MTJ structure to form a Wheatstone Bridge structure; and
the at least one metal line comprises two metal lines between the first dual MTJ structure and the second dual MTJ structure.

20. A method, comprising:
forming a first magnetic tunneling junction (MTJ) structure on a first wiring level;
forming a second MTJ structure on a same wiring level as the first wiring level of the first MTJ structure; and
forming at least one metal line between the first MTJ structure and the second MTJ structure,
wherein the at least one metal line is physically separated from the first MTJ structure and the second MTJ structure, and the at least one metal line provides a current in a direction different from a magnetization direction of the first MTJ structure and the second MTJ structure, and wherein the first MTJ structure and second MTJ structure are each located between upper and lower contacts.

* * * * *